(12) United States Patent
Ohki

(10) Patent No.: US 7,955,984 B2
(45) Date of Patent: Jun. 7, 2011

(54) HIGH SPEED HIGH POWER NITRIDE SEMICONDUCTOR DEVICE

(75) Inventor: Toshihiro Ohki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/979,135

(22) Filed: Oct. 31, 2007

(65) Prior Publication Data
US 2008/0157121 A1   Jul. 3, 2008

(30) Foreign Application Priority Data
Dec. 28, 2006  (JP) .................... 2006-353980

(51) Int. Cl.
*H01L 21/302* (2006.01)
(52) U.S. Cl. ........................ 438/706; 257/194
(58) Field of Classification Search .................. 257/194; 438/706, 689, 182, 174, 795
See application file for complete search history.

(56) References Cited

U.S. PATENT DOCUMENTS

| | | | | |
|---|---|---|---|---|
| 5,445,979 | A | * | 8/1995 | Hirano .......................... 438/167 |
| 5,521,731 | A | * | 5/1996 | Fukuyama et al. ............. 349/51 |
| 6,159,861 | A | * | 12/2000 | Asai et al. ..................... 438/706 |
| 7,229,900 | B2 | * | 6/2007 | Takayama et al. ............. 438/458 |
| 7,253,061 | B2 | * | 8/2007 | Peng et al. .................... 438/285 |
| 7,419,862 | B2 | | 9/2008 | Lim et al. ...................... 438/197 |
| 2006/0125001 | A1 | * | 6/2006 | Sriram .......................... 257/339 |
| 2007/0200142 | A1 | * | 8/2007 | Lee et al. ....................... 257/192 |

FOREIGN PATENT DOCUMENTS

| | | |
|---|---|---|
| JP | 63146439 A  *  6/1988 |
| JP | 2004-186679 | 7/2004 |
| KR | 2002-0082846 | 10/2002 |
| KR | 10-0631051 | 10/2006 |
| WO | WO 01/57929 A1 | 8/2001 |
| WO | WO 2004/066393 A1 | 8/2004 |

OTHER PUBLICATIONS

Office Action dated Aug. 17, 2009 in counterpart Korean patent application No. 10-2007-0120043 with English translation.
Seoul National University Master's Thesis p. 1-1.

* cited by examiner

*Primary Examiner* — Ori Nadav
(74) *Attorney, Agent, or Firm* — Kratz, Quintos & Hanson, LLP

(57) ABSTRACT

A nitride semiconductor device has: a substrate; a semiconductor lamination formed on the substrate, and including a channel layer of nitride semiconductor; source and drain electrodes formed on the semiconductor lamination in ohmic contact with the channel layer; an insulating layer formed on the semiconductor lamination, and having an opening in a gate electrode contact area, a total thickness portion having a flat surface and a total thickness in an area spaced apart from the opening, and a transient portion with monotonically changing thickness between the opening and the total thickness portion, a sidewall of the insulating layer facing the opening rising steeply to a partial thickness of the total thickness; and a T-shaped gate electrode contacting the semiconductor lamination layer in the opening and extending on the insulating film to portions with increased thickness thicker than the partial thickness.

9 Claims, 8 Drawing Sheets

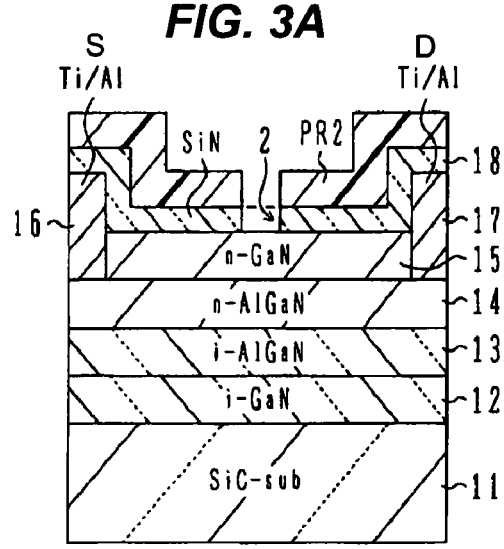
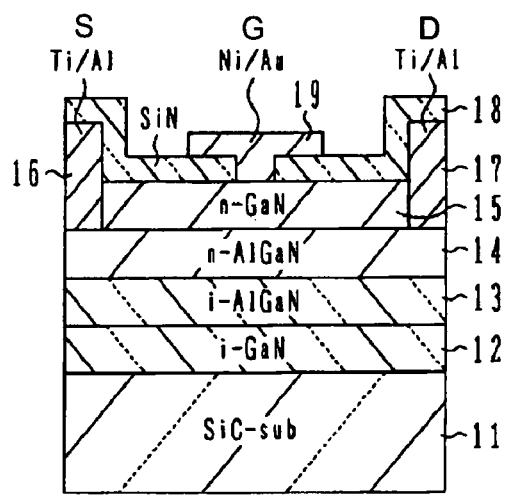
FIG. 3A
FIG. 3B

HIGH SPEED HIGH POWER NITRIDE SEMICONDUCTOR DEVICE

CROSS REFERENCE TO RELATED APPLICATION

This application is based on and claims priority of Japanese Patent Application No. 2006-353980 filed on Dec. 28, 2006, the entire contents of which are incorporated herein by reference.

BACKGROUND OF THE INVENTION

A) Field of the Invention

The present invention relates to a semiconductor device and its manufacture method, and more particularly to a semiconductor device using nitride semiconductor such as gallium nitride (GaN). The present invention is applicable to a nitride semiconductor device, particularly a high voltage breakdown nitride semiconductor device.

B) Description of the Related Art

Some transistors used in a base station of mobile phones and for satellite communications are required to realize high temperature operations, high speed switching and high power operations. Nitride semiconductor, typically gallium nitride (GaN), aluminum nitride (AlN), indium nitride (InN) and mixed crystal thereof have drawn attention as the material of high output power devices and short wavelength optical emission devices because of their excellent characteristics. Many reports have been made on field effect transistors, particularly high electron mobility transistors (HEMT's), as high output power devices. Typical HEMT's under researches are HEMT using a GaN layer as a channel layer and an n-type aluminum gallium nitride (AlGaN) layer as a carrier (electron) supply layer.

JP-A-2004-186679 teaches a method including processes of: depositing an amorphous GaN layer on a c-plane sapphire substrate by metal organic chemical vapor deposition (MOCVD); forming a crystalline GaN buffer layer by raising a temperature to 950° C.-1050° C.; forming GaN growth nuclei on the crystalline GaN buffer layer; forming a GaN channel layer having a thickness of 100 nm or thicker, an Si doped n-type AlGaN carrier supply layer having a thickness of 10 nm-20 nm and a Si doped n-type GaN contact layer having a thickness of 10 nm-20 nm by MOCVD; forming source/drain electrodes; then etching the n-type GaN contact layer in a gate electrode forming area; conducting an annealing process in a nitrogen atmosphere; and forming a gate electrode. It also teaches that if a silicon carbide (SiC) substrate is to be used, it is preferable to form the buffer layer of AlN.

International Publication WO2004-066393 teaches forming a GaN device layer on an Si substrate, via a buffer layer made of a lamination of a plurality of Al (In, B) GaN layers (e.g., alternate lamination of AlN layer, p-type GaN layer and GaN layer), and also teaches covering the surface of the device layer with a silicon oxide film, patterning the silicon oxide film to form an opening, and forming an electrode in the opening.

SUMMARY OF THE INVENTION

According to one aspect of the present invention, there is provided a nitride semiconductor device including:
a substrate being capable of epitaxially growing a nitride semiconductor layer thereon;
a semiconductor lamination layer formed on said substrate, and including a channel layer of nitride semiconductor;
a source electrode and a drain electrode formed on said semiconductor lamination layer in ohmic contact with said channel layer;
an insulating layer formed on said semiconductor lamination layer, and having an opening in a gate electrode contact area, a total thickness portion having a flat surface and a total thickness in an area spaced apart from said opening, and a transient portion between said opening and said total thickness portion, a sidewall of said insulating layer facing said opening rising steeply to a partial thickness of the total thickness; and
a T-shaped gate electrode contacting said semiconductor lamination layer in said opening and extending on said insulating film to opposing portions with increased thickness thicker than said partial thickness.

According to another aspect of the present invention, there is provided a method for manufacturing a nitride semiconductor device including the steps of:
(a) epitaxially growing a semiconductor lamination layer including a nitride semiconductor layer, on a substrate;
(b) forming a source electrode and a drain electrode respectively in ohmic contact with said semiconductor lamination layer;
(c) forming an insulating protective layer on said semiconductor lamination layer;
(d) etching said insulating protective layer by using a resist mask to form an opening portion, the insulating protective layer has a steeply raising sidewall at an opening edge to a partial thickness of a total thickness of said insulating protective film and reaching a total thickness portion via a transition portion which has monotonously increasing thickness with a distance from the opening edge; and
(e) forming a gate electrode contacting said semiconductor lamination layer in said opening and extending on said insulating protective layer to portions of increased thickness thicker than said partial thickness.

BRIEF DESCRIPTION OF THE DRAWINGS

FIGS. 3A and 3B are cross sectional views illustrating manufacture processes for the first sample.

DESCRIPTION OF THE PREFERRED EMBODIMENTS

Figure 1A:
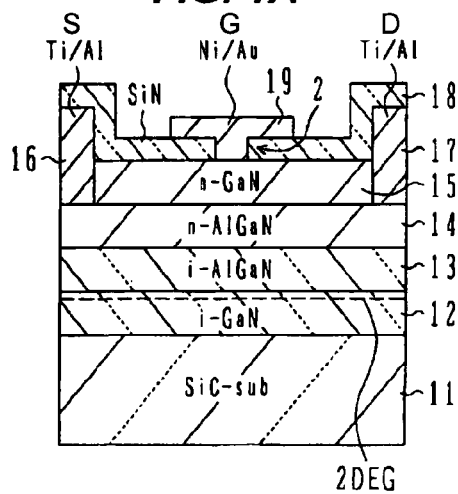
FIGS. 1A to 1C are cross sectional views showing the structures of the first and second samples (comparative examples of HEMT) and the third sample (a sample of the first embodiment) manufactured by the inventor.
Figure 1B:
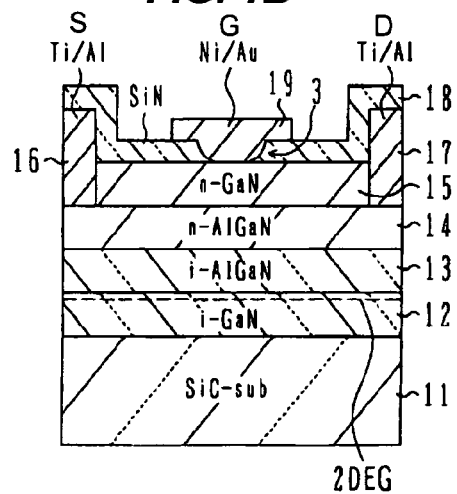
Figure 1C:
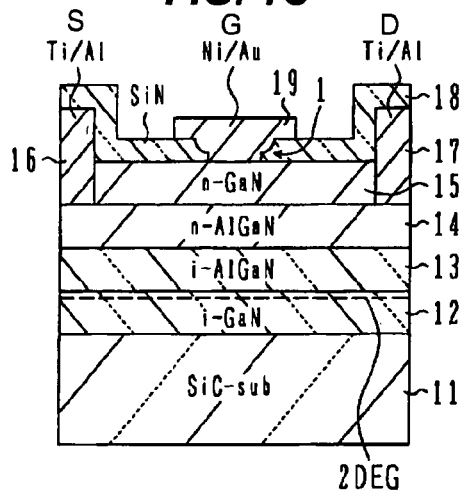

FIGS. 1A to 1C are cross sectional views showing the structures of three samples of GaN-based HEMT manufactured by the inventor. As shown in FIGS. 1A to 1C, epitaxially grown on a silicon carbide (SiC) substrate 11 are an i-type GaN carrier transport layer 12 having a thickness of 3 μm, an i-type AlGaN spacer layer 13 having a thickness of 5 nm, an n-type AlGaN carrier supply layer 14 having a thickness of 30 nm and an Si doping concentration of $5 \times 10^{18}$ cm$^{-3}$ and an n-type GaN cap layer 15 having a thickness of 10 nm and an Si doping concentration of $5 \times 10^{18}$ cm$^{-3}$. Two regions of the n-type GaN cap layer 15 are etched to expose the underlying n-type AlGaN carrier supply layer 14. A Ti layer and an Al layer are stacked on the exposed surfaces of the n-type AlGaN layer 14 to form a source electrode 16 and a drain electrode 17. A silicon nitride (SiN) layer 18 having a thickness of 100 nm is formed on the n-type GaN cap layer 15, covering the source electrode 16 and drain electrode 17. The structure formed by these processes is common to all the samples of three types. An opening is formed through the SiN layer 18. An Ni layer and an Au layer are stacked in an area including the opening to form a gate electrode 19. The cross sectional shape of the opening of the SiN layer is different among FIGS. 1A to 1C.

In FIG. 1A, a gate electrode opening 2 is formed through the SiN layer 18, having generally a vertical sidewall. In FIG. 1B, an opening 3 is formed through the SiN layer 18, gradually increasing the opening width starting from a semiconductor layer contact interface toward an upper level. In FIG. 1C, an opening is formed through the SiN layer 18, rising at a steep gradient to some height from an opening bottom and thereafter gradually increasing the opening width at a gentle gradient toward an upper level. The Ni layer and Au layer are stacked covering the opening and extending to the flat surfaces of the SiN layer on both sides of the opening. The HEMT structures of these three types were formed.

An interface of the i-type GaN carrier transport layer 12 contacting the i-type AlGaN spacer layer 13 forms a deep potential well. The n-type AlGaN carrier supply layer 14 supplies electrons to the potential well via the spacer layer 13 so that two dimensional gas 2DEG is generated. The n-type GaN cap layer 15 raises the Schottky barrier of the gate electrode 19 relative to the two dimensional electron gas 2DEG, by the piezoelectric effect. Electric field is relaxed by doping n-type impurities. No charge carriers remain in the n-type GaN cap layer 15 having a thickness of 10 nm.

FIGS. 2A to 2F are cross sectional views illustrating the manufacture processes of the HEMT structure shown in FIG. 1C.

Figure 2A:
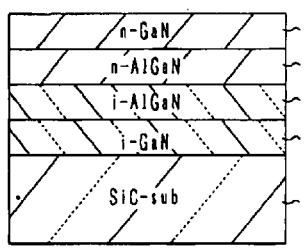
FIGS. 2A to 2F are cross sectional views illustrating manufacture processes for the third sample (HEMT of the first embodiment).

As shown in FIG. 2A, GaN-based HEMT device layers are grown by metal organic vapor phase epitaxy (MOVPE). Trimethylgallium (TMG) is used as Ga source gas, trimethylaluminum (TMA) is used as Al source gas, ammonium (NH$_3$) is used as N source gas, and monosilane (SiH$_4$) is used as n-type impurity Si source gas. Hydrogen (H$_2$) and nitrogen (N$_2$) are used as carrier gas. Sequentially and epitaxially formed by MOVPE on an SiC substrate 11 at a substrate temperature of 1100° C. are an i-type GaN carrier transport layer 12 having a thickness of 3 μm, an i-type AlGaN spacer layer 13 having a thickness of 5 nm, an n-type AlGaN carrier supply layer 14 having a thickness of 30 nm and an Si doping concentration of $5 \times 10^{18}$ cm$^{-3}$ and an n-type GaN cap layer 15 having a thickness of 10 nm and an Si doping concentration of $5 \times 10^{18}$ cm$^{-3}$.

Figure 2B:
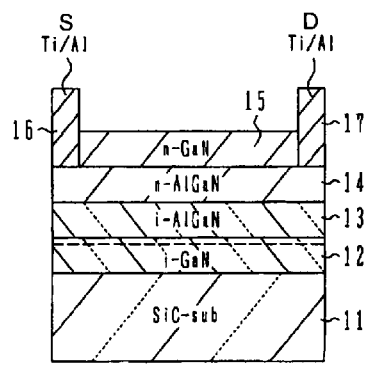

As shown in FIG. 2B, a resist mask is formed having openings in regions corresponding to the areas where source and drain electrodes are to be formed. The n-GaN cap layer 15 is etched by dry etching using chlorine containing gas. It is not necessary that an etching termination point is strictly at an interface between the n-GaN layer and the n-AlGaN layer. A Ti layer and an Al layer are deposited by vapor deposition, and thereafter the resist mask is removed. A source electrode 16 and a drain electrode 17 are therefore formed by lift-off. Ohmic characteristics are established by heat treatment in a nitrogen atmosphere at a temperature of 400° C. to 600° C., in this sample, at a temperature of 600° C.

Figure 2C:
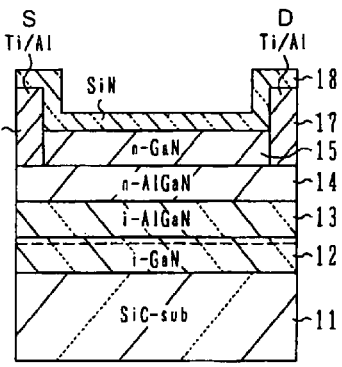

As shown in FIG. 2C, covering the source electrode 16 and drain electrode 17, an SiN layer 18 is deposited on the whole surface of the GaN cap layer 15 to a thickness of 5 nm to 500 nm, in the sample, to a thickness of 100 nm. These processes are common to all samples of three types.

Figure 2D:
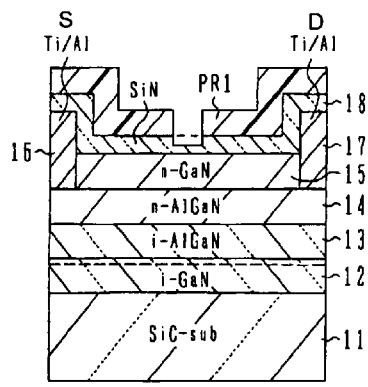

As shown in FIG. 2D, a resist mask PR1 is formed having an opening in a gate electrode contact area. The SiN layer 18 is etched, under an anisotropic dry etching condition using SF$_6$, to a depth corresponding to 20% to 80% of the layer thickness, in this sample, to a depth of 50 nm corresponding to a half the layer thickness of 100 nm. Although SF$_6$ was used as etching gas for forming the sample, other fluorine containing gas such as CF$_4$ and C$_3$F$_8$ may also be used.

Figure 2E:
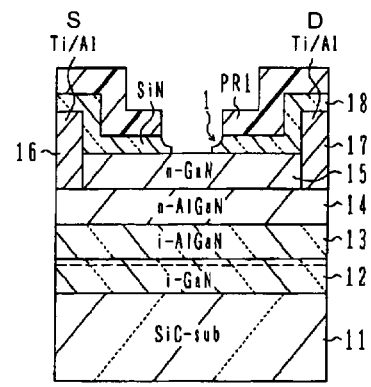

As shown in FIG. 2E, by using mixture gas of SF$_6$ and oxygen gas O$_2$ as etching gas, the remaining thickness of the SiN layer 18, in this sample, 50 nm, is etched by dry etching at a pressure of 5 Pa and a power of 50 W, while the resist opening edge is retracted in a lateral direction. An opening edge 1 of the SiN layer 18 rises at a steep gradient in a lower portion, in this sample having a thickness of about 50 nm. Then, the gradient changes to a gentler slope, thereby gradually increasing the width in the upper portion. The SiN film 18 has a predetermined thickness at the edge, in this sample, a thickness of about 50 nm, and gradually increases its thickness toward the source electrode 16 and drain electrode side 17 to reach the flat portion (total thickness portion) having a thickness of 100 nm. The etching resist mask PR1 is thereafter removed.

Figure 2F:
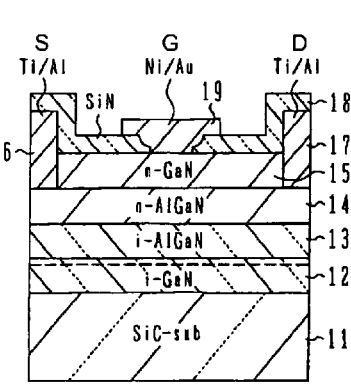

As shown in FIG. 2F, a resist mask is formed having an opening wider than the opening of the SiN film 18, an Ni layer and an Au layer are deposited by vapor deposition and a gate electrode 19 is formed by lift-off. In conformity with the cross sectional shape of the opening of the SiN film having a sidewall at the opening edge steeply rising to a partial thickness and reaching the total thickness portion via a transition portion monotonously increasing the thickness with the distance from the opening edge, the cross sectional shape of the gate electrode 19 rises at a steep gradient in the lower portion, changes to a gentle gradient in the upper portion to form a slope gradually increasing the opening width, and has a flat bottom outside the slope.

FIGS. 3A and 3B are cross sectional views illustrating manufacture processes for the HEMT structure shown in FIG. 1A.

As shown in FIG. 3A, after the processes shown in FIGS. 2A to 2C are executed, a resist mask PR2 is formed having an opening in a gate electrode contact area similar to FIG. 2D. The whole thickness of the SiN film 18 is etched by anisotropic etching using SF$_6$ gas. An opening edge 2 of the SiN film 18 has a sidewall rising generally vertically.

As shown in FIG. 3B, a resist mask is formed having an opening wider than the opening of the SiN film 18, and a gate electrode 19 is formed by lift-off similar to the process shown in FIG. 2F. An opening edge of the SiN film 18 has a predetermined thickness from the bottom, and the upper surface of the SiN film is flat. It can be said that the opening is formed through the SiN film 18 only by the process similar to that shown in FIG. 2D.

Figure 4A:
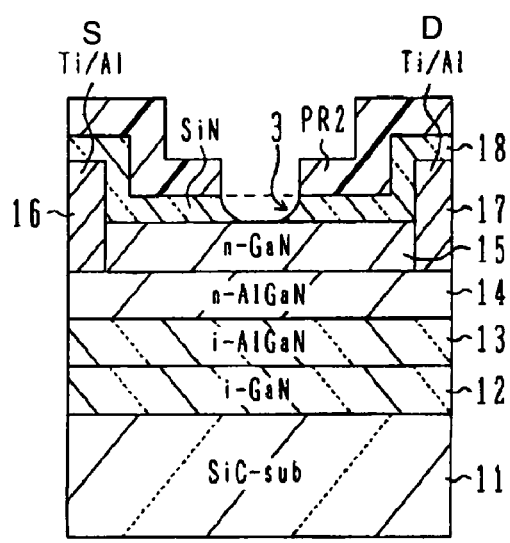
FIGS. 4A and 4B are cross sectional views illustrating manufacture processes for the second sample.
Figure 4B:
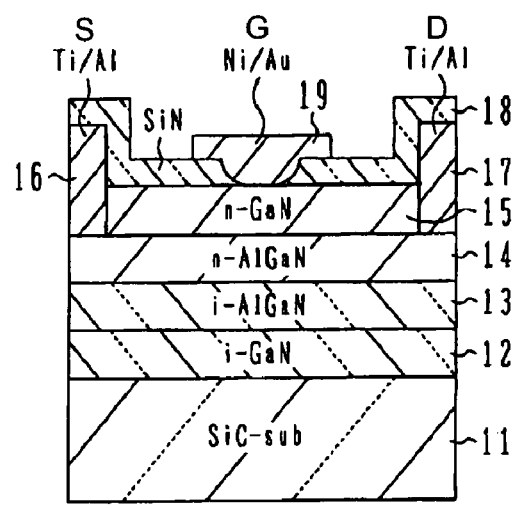

FIGS. 4A and 4B are cross sectional views illustrating manufacture processes for the HEMT structure shown in FIG. 1B.

As shown in FIG. 4A, after the processes shown in FIGS. 2A to 2C are executed, a resist mask PR3 is formed having an opening in a gate electrode contact area similar to FIG. 2D. The whole thickness of the SiN film 18 is etched by dry etching using mixture gas of $SF_6$ gas and $O_2$ gas, while the resist opening edge is retracted in a lateral direction. The opening 3 of the SiN film 18 has a cross sectional shape that the opening width gradually increases with the distance from the opening edge and a thickness of the SiN film gradually increases. It can be said that the opening of the SiN film 18 is formed only by the process similar to that shown in FIG. 2E. The SiN film is thin at the opening edge.

The characteristics of these samples of three types were evaluated. A voltage of 100 V was applied across the gate and drain. A reverse direction leak current between gate/drain two terminals was smallest, 5 µA/mm, in the third sample. The first sample is subjected to etching under the condition that a generally vertical sidewall is formed. It is said that the generally vertical sidewall occurs when etching is done in an atmosphere containing C or H, which generates deposition on the sidewall. Occurrence of deposition may not be limited when C or H is supplied in gas phase. It may also occur from resist. It can be considered that leak current flows because deposition during etching remains on the sidewall as residue. The second sample is subjected to etching of high isotropy so that etching residue is hard to occur. However, since the SiN film is thin at the opening edge, it can be considered that dielectric breakdown may occur if a potential difference between the top and bottom surfaces of the SiN film becomes large due to a voltage drop in the channel layer. The third sample is first subjected to etching which may form residue. The third sample is thereafter subjected to etching which is hard to cause residue, and the resist sidewall becomes spaced apart from the opening edge, it can be considered that residue which may cause leak is hard to remain and that since a predetermined SiN film thickness can be obtained even at the opening edge, dielectric breakdown is hard to occur. The third sample is the first embodiment.

Suppression of leak current may be ascribed to the etching which increases the opening width in the opening upper portion. Although the gate electrode extends to the total thickness portion, it may be sufficient if the gate electrode extends from the opening edge to the thickness increased portion.

Figure 5A:
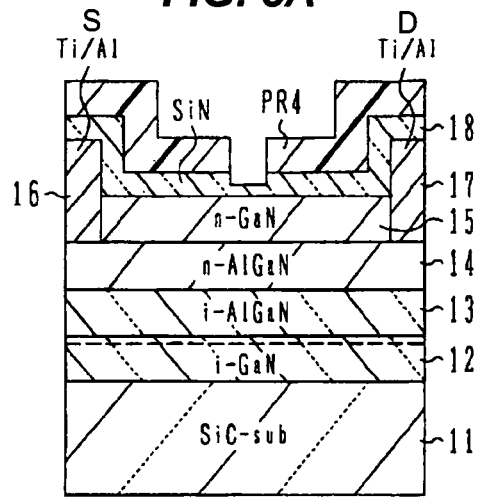
FIGS. 5A to 5D are cross sectional views illustrating manufacture processes for HEMT according to the second embodiment.

FIGS. 5A to 5D are cross sectional views illustrating a method for manufacturing a GaN-based HEMT according to the second embodiment. FIG. 5A shows the state similar to FIG. 2D. The state shown in FIG. 5A is obtained by the processes described with reference to FIGS. 2A to 2D. The SiN film 18 is etched to an intermediate depth of 20% to 80% of its thickness, and the sidewall of the opening has a steep gradient.

Figure 5B:
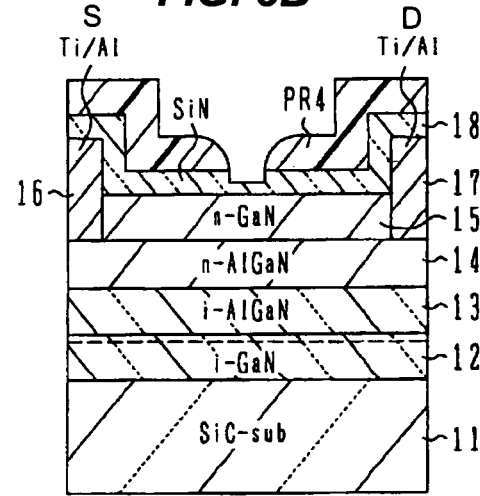

As shown in FIG. 5B, a resist mask PR4 is heated (cured) to round the upper edge corner. The resist mask increases its thickness as a distance from the opening edge becomes longer, and eventually saturates its thickness. In other words, the resist thickness becomes thinner at the position nearer to the opening edge.

Figure 5C:
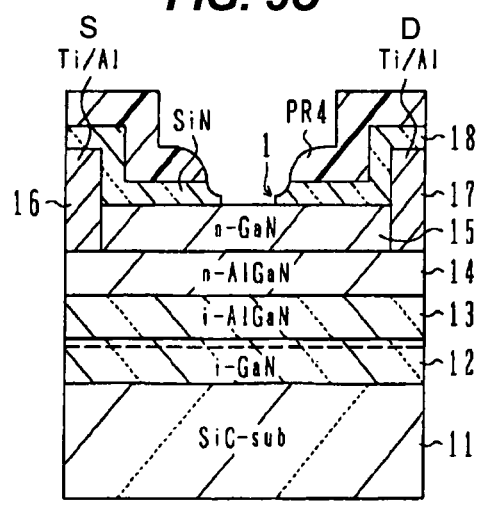

As shown in FIG. 5C, etching is further performed by using fluorine-containing gas. Since a thickness of the resist is reduced at the opening edge, the opening edge retracts as the resist is consumed. It can be considered that residue is hard to be formed on the SiN sidewall spaced away from the resist. After etching, the resist mask PR4 is removed.

Figure 5D:
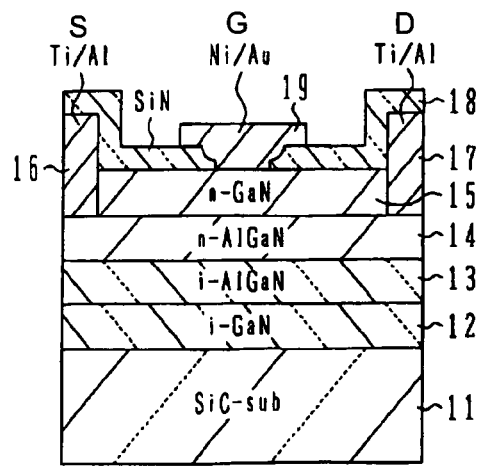

As shown in FIG. 5D, a gate electrode 19 is therefore formed by lift-off.

Figure 6A:
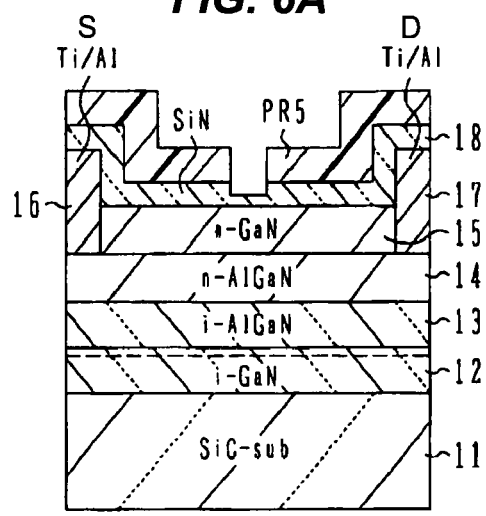
FIGS. 6A to 6D are cross sectional views illustrating manufacture processes for HEMT according to the third embodiment.

FIGS. 6A to 6D are cross sectional views illustrating a method for manufacturing a GaN-based HEMT according to the third embodiment. FIG. 6A shows the state similar to FIG. 2D. The state shown in FIG. 6A is obtained by the processes described with reference to FIGS. 2A to 2D. The SiN film 18 is etched to a depth of 20% to 80% of its thickness, and the sidewall of the opening has a steep gradient.

Figure 6B:
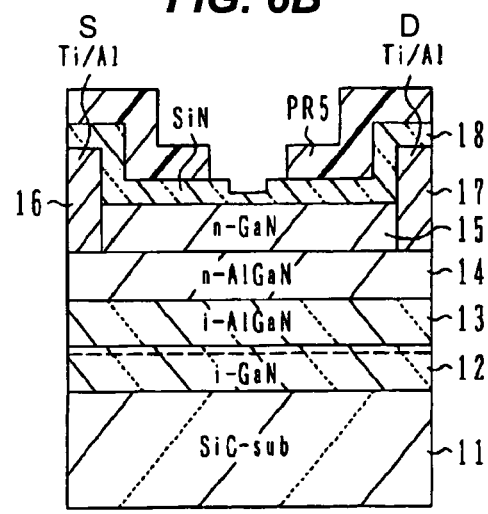

As shown in FIG. 6B, a resist mask PR5 is retracted by oxygen plasma. As the resist mask PR5 is retracted from the etched groove, partial upper surfaces of the SiN film 18 are exposed.

Figure 6C:
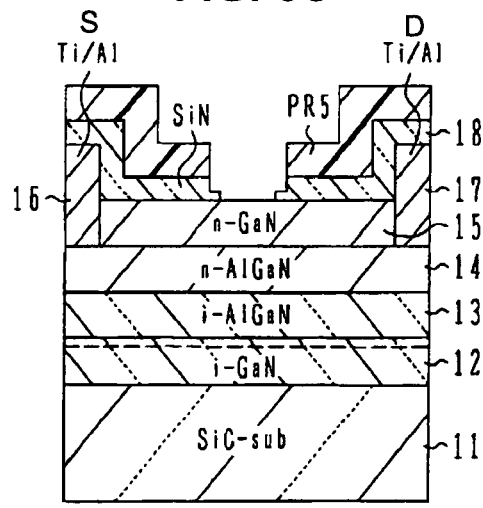

As shown in FIG. 6C, etching is further performed by using fluorine-containing gas. It can be considered that residue is hard to occur on the SiN surface spaced apart from the resist. After etching, the resist mask PR5 is removed.

Figure 6D:
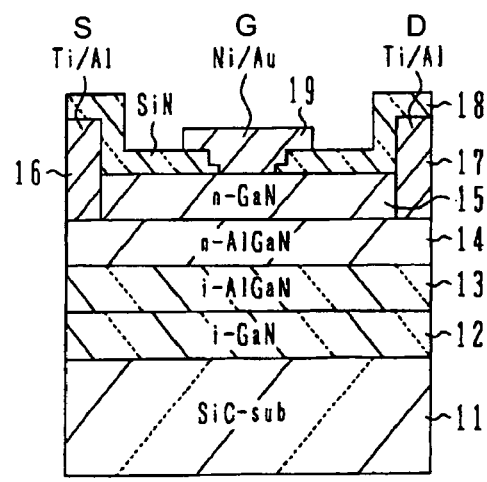

As shown in FIG. 6D, a gate electrode 19 is therefore formed by lift-off. In this embodiment, a plurality of steps may be formed on the SiN film in the opening upper portion, and the gate electrode may extend from the inside of the opening to the opposing increased thickness portions.

In the embodiments described above, the protective film is made of a single SiN film. A laminated protective film may also be used.

Figure 7A:
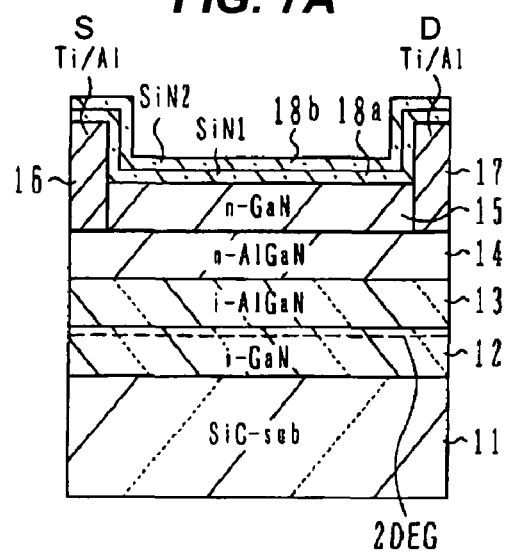
FIGS. 7A and 7B are cross sectional views illustrating manufacture processes for HEMT according to the fourth embodiment.
Figure 7B:
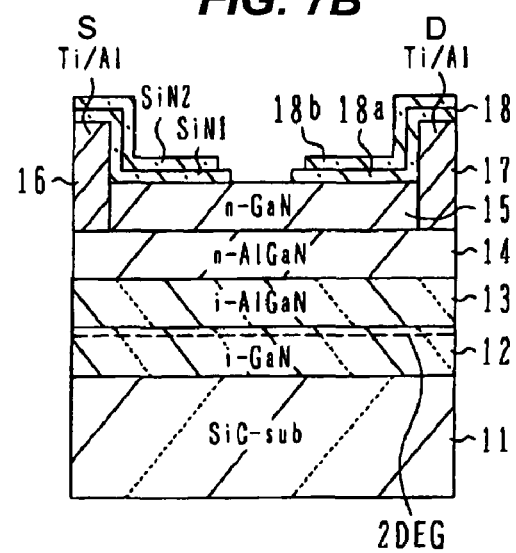

FIG. 7A shows a protective film 18 which is made of a lamination of a first SiN film 18a and a second SiN film 18b and covers an n-type GaN layer 15, a source electrode 16 and a drain electrode 17. If an SiN film is deposited by plasma CVD, a refractive index can be adjusted by selecting a deposition condition. As the refractive index is changed, etching characteristics are also changed. For example, an etching rate of the second SiN film 18b is set faster than that of the first SiN film 18a. FIG. 7B is a schematic diagram showing an example of the shape of an opening of the SiN film 18 after etching. A lamination structure of three or more layers may be used. The gate electrode may extend from the opening edge to the upper surface of an increased thickness step. A protective film made of a plurality of layers may be combined with any of the embodiments described above.

Although description has been made by using HEMT, a semiconductor device to be manufactured is not limited to HEMT.

Figure 8:
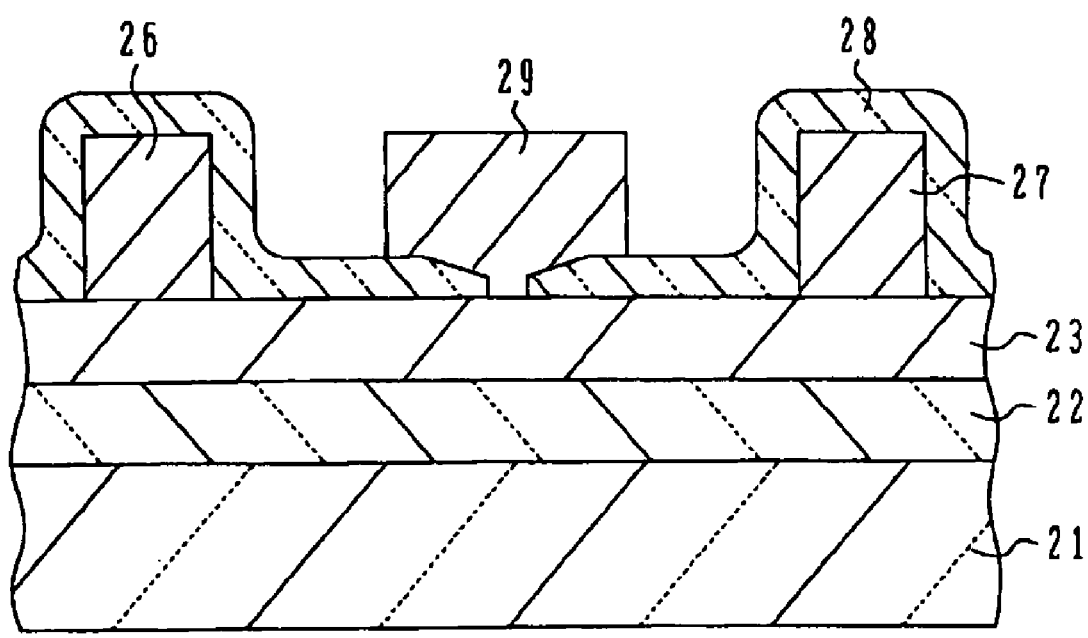
FIG. 8 is a cross sectional view showing the structure of a field effect transistor (FET) according to another embodiment.

FIG. 8 shows an example of a field effect transistor. A GaN buffer layer 22 and an n-type GaN channel layer 23 are epitaxially grown on an SiC substrate 21. A source electrode 26 and a drain electrode 27 are formed on the n-type GaN layer 23 to the right and left as viewed in FIG. 8, and covered with an SiN protective film 28. An opening is formed through the SiN protective film 28, and a gate electrode 29 is formed covering the opening. The opening edge rises steeply in the lower portion of the opening, and the gradient changes to a gentle gradient in the upper portion. This structure corresponds to a structure that the n-type AlGaN layer and n-type GaN cap layer are omitted in the HEMT structure and the channel layer is changed from an i-type to an n-type. This field effect transistor can be formed by omitting unnecessary processes from the processes of the embodiments described above.

The present invention has been described in connection with the preferred embodiments. The invention is not limited only to the above embodiments. In the description, although the gradient of the insulating film side wall changes on both sides of the gate electrode, the gradient may be changed only on the drain side. In the description, although the silicon nitride film is used as the protective insulating film, other insulating materials may also be used, such as silicon oxide, silicon oxynitride and alumina. In the description, although the SiC substrate is used as the substrate, substrates made of other materials such as sapphire, Si and GaAs may be used on which a nitride semiconductor layer can be epitaxially grown.

The materials and structures of electrodes may adopt those commonly known. The manufacture processes of electrodes are not limited to vapor deposition. Other processes, such as sputtering and plating may also be employed. If ohmic performance of the source/drain electrodes are ensured, annealing may be omitted. If the Schottky characteristics can be obtained, the gate electrode may be annealed. As etching of isotropical property, wet etching may be used. Materials, film thicknesses and the like may be changed in various ways. It will be apparent to those skilled in the art that other various changes, modifications, substitutions, improvements, combinations thereof, and the like can be made.

What are claimed are:

1. A method for manufacturing a nitride semiconductor device comprising:
   epitaxially growing a lower nitride semiconductor layer and an upper nitride semiconductor layer, over a substrate;
   etching said upper nitride semiconductor layer at a source contact region and a drain contact region;
   forming a source electrode at said source contact region and a drain electrode at said drain contact region, respectively in ohmic contact with said lower nitride semiconductor layer;
   forming an insulating protective film over said upper nitride semiconductor layer covering said source electrode and said drain electrode;
   etching said insulating protective film by using a resist mask to form an opening portion, including
   performing first anisotropic etching to form an opening in the insulating protective film reaching an intermediate depth,
   after performing the first anisotropic etching, rounding resist corners at an opening edge by curing resist, and,
   after rounding the resist corners at the opening edge, performing second anisotropic etching, so that the insulating protective film has a steeply rising sidewall at an opening edge to a partial thickness of a total thickness of said insulating protective film and reaching a total thickness portion via a transition portion which has monotonously increasing thickness with a distance from the opening edge; and
   forming a gate electrode over said upper nitride semiconductor layer in said opening and extending on said insulating protective film to portions of increased thickness thicker than said partial thickness.

2. The method for manufacturing a nitride semiconductor device according to claim 1, wherein said increased thickness is the total thickness.

3. The method for manufacturing a nitride semiconductor device according to claim 1, wherein said curing includes heating.

4. The method for manufacturing a nitride semiconductor device according to claim 1, wherein said upper nitride layer is an n-type GaN layer, said opening portion exposes the n-type GaN layer formed on said lower nitride semiconductor layer.

5. The method for manufacturing a nitride semiconductor device according to claim 1, wherein the intermediate depth is in a range of 20% to 80% of the insulating film.

6. The method for manufacturing a nitride semiconductor device according to claim 4, wherein said lower nitride semiconductor layer includes lamination of i-type GaN layer, I-type AlGaN layer, and n-type AlGaN layer from the bottom.

7. The method for manufacturing a nitride semiconductor device according to claim 5, wherein said insulating protective film is a silicon nitride film.

8. The method for manufacturing a semiconductor device according to claim 7, wherein said substrate is a SiC substrate.

9. The method for manufacturing a semiconductor device according to claim 7, wherein the steps are performed in the order recited.

* * * * *